United States Patent [19]

Guinet et al.

[11] Patent Number: 5,150,830

[45] Date of Patent: Sep. 29, 1992

[54] METHOD OF BONDING A SHEET OF METAL, SUCH AS COPPER, ON AN ALUMINUM NITRIDE SUBSTRATE

[75] Inventors: Jannick Guinet, Soisy Sous Montmorency; Jean-Claude Hubert, Sucy En Brie; Jean Jarrige; Jacques Mexmain, both of Limoges; Jean-Pascal Michelet, Bessines, all of France

[73] Assignee: Telemecanique, France

[21] Appl. No.: 658,268

[22] Filed: Feb. 20, 1991

[30] Foreign Application Priority Data

Feb. 20, 1990 [FR] France .................. 90 02029

[51] Int. Cl.$^5$ .................. B23K 1/20; C23C 8/12
[52] U.S. Cl. .................. 228/124; 156/281; 156/325; 148/285; 228/211; 427/377
[58] Field of Search .............. 228/124, 203, 211; 148/285; 156/325, 281; 427/377

[56] References Cited

U.S. PATENT DOCUMENTS

| | | | |
|---|---|---|---|
| 2,754,456 | 7/1956 | Madelung | 148/285 |
| 4,542,073 | 9/1985 | Tanaka et al. | 156/325 |
| 4,693,409 | 9/1987 | Mizunoya et al. | 228/124 |
| 4,860,939 | 8/1989 | Guinet et al. | 228/124 |

FOREIGN PATENT DOCUMENTS 0170012  5/1986  European Pat. Off.
2623046  5/1989  France

OTHER PUBLICATIONS

A. Schmitt, "Method of Producing Silicon Dioxide Layers with Uniform Thickness", IBM Tech. Disc. Bull., vol. 23, No. 9, Feb. 1981.
Proceedings of the Hybrid Microelectronics Conference, May 1989, Hamburg, pp. 1–8; Y. Kuromitsu et al.; "Surface Treatment of AlN Substrate".
Chemical Abstracts, vol. 108, No. 14, Apr. 1988, Columbus, Ohio U.S.A. Y. Kurihara et al.: "Metallized Aluminum Nitride Sintered Body and its Manufacture", Ref. No. 117638D.
Annales De Chimi Francais, vol. 10, 1985, pp. 79–83, S. Yefsah et al.: "Comportement dans la vapeur d'eau a haute temperature du nitrure d'aluminium".

Primary Examiner—Kurt Rowan
Assistant Examiner—Jeffrey T. Knapp
Attorney, Agent, or Firm—William A. Drucker

[57] ABSTRACT

A method of bonding a sheet of metal such as copper on a substrate of aluminum nitride, the method comprising the following steps known per se: i) growing a layer of alumina on the aluminum nitride substrate by means of heat treatment; and ii) placing the sheet of metal on the alumina layer and then bonding them together; the method being wherein alumina-growing step i) is performed under a controlled oxidizing atmosphere which is free from moisture.

7 Claims, 1 Drawing Sheet

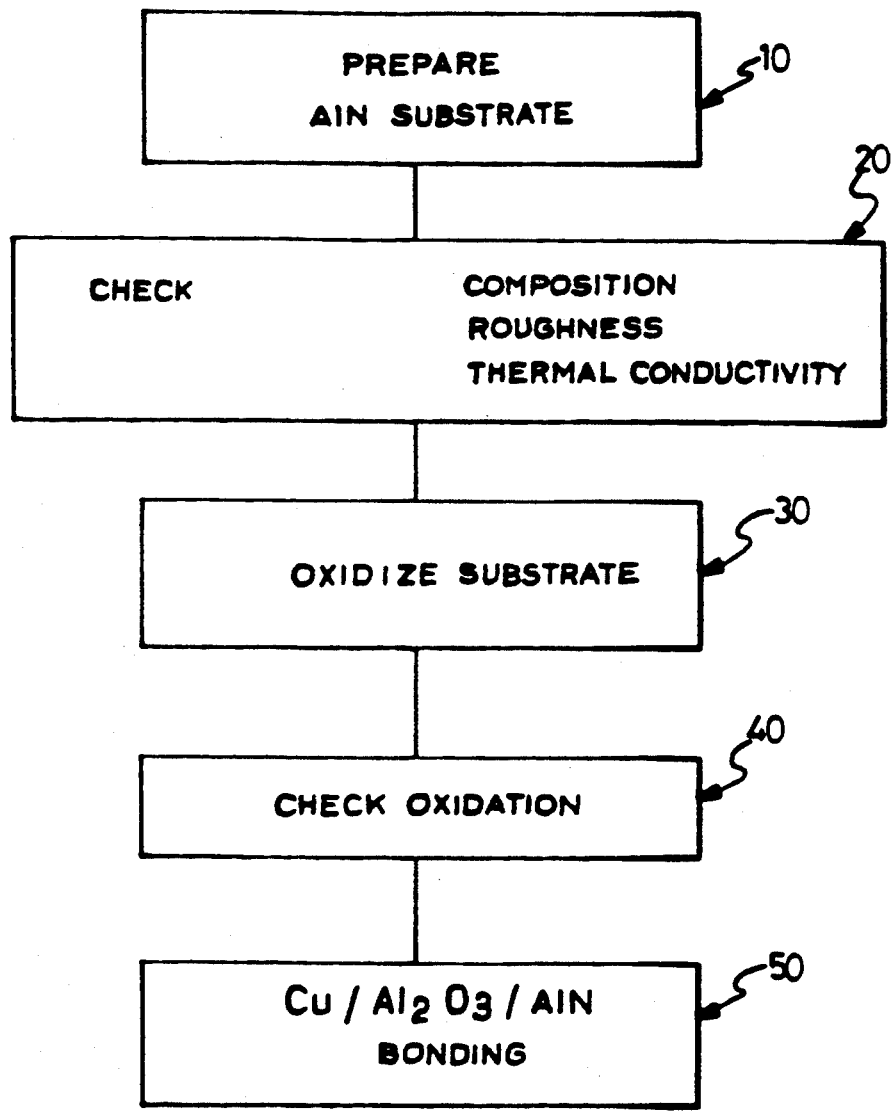

METHOD OF BONDING A SHEET OF METAL, SUCH AS COPPER, ON AN ALUMINUM NITRIDE SUBSTRATE

The present invention relates to the field of bonding a sheet of metal, such as copper, on an aluminum nitride substrate.

The present invention is particularly applicable to making electronic power modules.

BACKGROUND OF THE INVENTION

The manufacture of electronic power modules requires materials to be used that have good electrical insulation properties together with good thermal conduction properties. In addition, the materials used must have a coefficient of expansion which is close to that of the semiconductor materials used, such as silicon. Further, it is naturally desirable for the material used in making the above-mentioned modules to be as cheap as possible.

Various different processes have already been proposed for bonding a sheet of metal, in particular copper, to an electrically insulating ceramic substrate, and in particular aluminum nitride.

For example, Document EP-A-0 123 212 describes a method of bonding a sheet of copper on an aluminum nitride substrate, which method consists in using heat treatment to cause a layer of alumina to grow on the aluminum nitride substrate, and then in placing a sheet of copper on the layer of alumina and bonding the sheet of copper to the layer of alumina by a method which is known per se.

More precisely, above-mentioned Document EP-A-0 123 212 teaches, in particular, bonding a sheet of copper with an AlN substrate by generating a layer of alumina on the substrate by exposing it to air at 1200° C. for a period of two to five hours, then applying the sheet of copper and heating to 1078° C. for 15 minutes (min) under a nitrogen atmosphere to obtain good connection by virtue of the resulting layer of $Al_2O_3$–$Cu_2O$.

Although this technique is currently widely used in industry, it does not give full satisfaction.

The copper-alumina bond is often unsatisfactory. The copper sheet can frequently be torn off with ease.

An examination of products obtained in this way reveals the presence of bubbles beneath the copper sheet, thereby spoiling the mechanical strength of the bond.

For example, the following documents describe this bubble formation: 1) J. Am. Ceram. Soc. 72 [8]1322-27 (1989), pp. 1322-1327 Role of oxygen in bonding copper to alumina—Yuichi Yoshino; 2) Materials Research Society, Symp. Proc. Vol. 40, 1985, Eutectic bonding of copper to ceramics—Marc Wittner; 3) Mat. Res. Soc. Symp. Proc. Vol. 40 1985 Material Research Society, Directly bonded copper metallization of AlN substrates for power hybrids, Petra Kluge Weiss et al.; 4) IEEE 0569, 5503, 89, 0029, Behavior of aluminum nitride ceramic surfaces under hydrothermal oxidation treatments, D. Suryanarayana et al.

In addition, examining products obtained by performing the method taught in Document EP-A-0 123 212 generally reveals the presence of cracking in the alumina layer. Such cracking is mentioned in particular in the document IEEE Transactions on Components, Hybrids, and Manufacturing Technology, Vol. 12, No. 3, Sep. 1989, The influence of moisture on surface properties and insulation characteristics of AlN substrates, Yasutoshi Kurihara et al.

A great deal of research has already been performed in an attempt to improve the bonding between a metal sheet and aluminum nitride.

In particular, attempts have been made to observe the influence of alumina layer thickness on bubble formation by performing numerous tests with alumina layers of different thicknesses. In general, these tests have shown that the number and volume of the bubbles increases with increasing thickness of the alumina layer. Persons skilled in the art have thus attempted to make devices having a thin alumina layer. However, these tests have not given satisfaction. They give rise to an unsatisfactory bond.

Attempts have also been made to observe the influence of heat treatment temperature on bubble formation, in particular the temperature during the oxidizing stage. These tests have not given decisive results.

Finally, other tests have attempted to show the influence of water vapor on the overall bonding process. For example, such tests are described in the documents Ann. Chim. Fr. 1985, 10, pp. 79-83, entitled (in translation) Behavior of sintered aluminum nitride in water vapor at high temperature by Y. Yefsah et al.; and 7th European Hybrid Microelectronics Conference, Hamburg, May 1989, Surface treatment of AlN substrate, Yoshirou Kuromitsu et al. In outline, these tests have thus far merely indicated that the presence of water vapor makes it possible to increase the speed of oxidation. That is why the person skilled in the art has been inclined up till now to use a somewhat damp atmosphere during oxidation heat treatment in order to shorten the overall process.

In order to eliminate bubbles, the person skilled in the art is thus generally constrained to make grooves in the surface of the metal sheet to serve as drainage channels, as taught in Document DE-A-3 324 661, for example. It would appear that such grooves do indeed limit air bubble formation at the metal/substrate interface. However, the above-mentioned grooves facilitate unwanted diffusion of etching agents between the metal sheet and the substrate during any subsequent subtractive method of obtaining a specific pattern of metal areas.

In conclusion, the techniques proposed so far for bonding a sheet of copper to a substrate of electrically insulating material have not given full satisfaction.

An object of the present invention is to provide a novel method of bonding a sheet of metal, preferably copper, onto an aluminum nitride substrate.

SUMMARY OF THE INVENTION

According to the present invention, this object is achieved by a method comprising the following steps known per se:

i) growing a layer of alumina on the aluminum nitride substrate by means of heat treatment; and ii) placing the sheet of metal on said alumina layer and then bonding them together;

the method being characterized by the fact that alumina-growing step i) is performed under a controlled oxidizing atmosphere which is free from moisture.

Thus, by going against preconceived ideas that have led the person skilled in the art to use an atmosphere rich in water vapor for the purpose of accelerating the process, the Applicant has determined that, on the contrary, such water vapor should carefully be eliminated.

BRIEF DESCRIPTION OF THE DRAWINGS

The method of the present invention is illustrated diagrammatically in the sole figure of the accompanying drawing.

DETAILED DESCRIPTION

As shown in the accompanying figure and as mentioned above, the method of the present invention comprises two essential steps 30 and 50 respectively constituted by:

i) oxidizing the surface of the aluminum nitride substrate under an oxidizing atmosphere which is free from water vapor; and ii) bonding a sheet of metal, preferably copper, on the alumina layer.

Substrate oxidation step 30 is preceded by a prior step 10 of preparing the AlN substrate, and generally by an intermediate step 20 of checking the substrate. This checking step is known per se to the person skilled in the art and may consist, for example, in checking the composition of the substrate, its roughness, and its thermal conductivity.

Substrate oxidation step 30 which according to an essential characteristic of the invention is performed under an oxidizing atmosphere that is free from water vapor, preferably corresponds to a slow oxidation stage. However it could alternatively be a rapid oxidation stage.

For example, the slow oxidation stage which is presently preferred, may be performed at a temperature lying in the range 1000° C. to 1200° C. for a period of time lying in the range 12 hours to 30 hours.

A rapid oxidation stage can be implemented by subjecting the AlN substrate to a temperature of 1420° C. to 1500° C. for a period of time less than 5 minutes, still under an oxidizing atmosphere which is free from water vapor.

By way of example, the oxidizing atmosphere used during step 30 may comprise an atmosphere of pure oxygen satisfying the following requirements:

$O_2$ 99.998% to 99.5%
$H_2O < 5$ ppm
$H_2 < 2$ ppm
$A_r N_2 < 14$ ppm
$CO + CO_2 < 1$ ppm Where applicable, oxidation step 30 is followed by a step 40 in which the resulting alumina layer is checked prior to implementing the metal/alumina bonding step 50 per se.

The copper/alumina bonding step is preferably performed in accordance with the teaching of the Applicants' prior French patent filed Nov. 10, 1987 under the number 87 15547 and published under the number 2 623 046.

Reference may usefully be made to the text of said patent, which text should be considered as being incorporated into the present application by this reference made thereto.

It is recalled that that prior patent number 2 623 046 teaches a method of bonding a sheet of copper directly on an alumina substrate, which method consists in:

1) cleaning the copper to eliminate traces of surface oxidation thereon prior to placing the copper on the substrate;

2) heating the copper/substrate assembly under an inert atmosphere until a temperature is reached higher than the temperature at which a copper-based eutectic forms with the reactive gas, and lower than the melting temperature of copper; and 3) applying an oxidizing reactive gas only after the temperature higher than the eutectic formation temperature has been reached, so that said temperature is reached before any oxidation of the copper sheet.

It is recalled that patent number 2623046 also teaches: using a sheet of copper having a phosphorus content of less than 0.0015% and an oxygen content lying in the range 0.0020% and 0.0024% by weight;

using, for example, a sheet of annealed type copper having a hardness lying in the range 43 HV to 45 HV;

performing the cleaning step, e.g. in the form of an initial cleaning stage in a solution of dilute hydrochloric acid and a subsequent washing stage in deionized water;

assembling the copper to the $Al_2O_3$ in three consecutive elementary steps: raising the temperature, maintaining the temperature, and cooling. The temperature rise takes place under an inert atmosphere, preferably of nitrogen. The step of raising the temperature under an inert atmosphere is continued until a surface temperature is obtained that is higher than the temperature at which a eutectic should theoretically be obtained, i.e. at a temperature of more than 1065° C. when an oxidizing reactive gas is used. The second step of the assembly process consists in maintaining a treatment temperature lying between the eutectic formation temperature, i.e. 1065° C., and the copper melting point temperature, i.e. 1083° C., while simultaneously applying an oxidizing reactive gas. The treatment temperature during the second step is preferably equal to 1075° C.±2°. The oxidizing reactive gas that is applied during the second step is preferably constituted by oxygen at a partial pressure of 50 ppm to 100 ppm, and advantageously 70 ppm. The step of maintainig the temperature at about 1075° C. under an atmosphere of reactive gas may last for about 2 minutes to about 4 minutes. Finally, the cooling step is performed under an inert atmosphere, and preferably nitrogen. The applicant has obtained fully satisfactory results by performing heat treatment under a controlled atmosphere in a through-type furnace with a travel speed of about 5 cm/min, and with a total treatment time (temperature rise, steady temperature, cooling) of about 45 min.

Compared with conventional techniques, the method of the present invention offers numerous advantages, and in particular:

a) in spite of some of the parameters being variable, and in particular the duration of the oxidation stage 30, the invention makes it possible to obtain an alumina layer of thickness which is more constant and more regular under oxygen which is free from water vapor than can be obtained under air;

tests performed by the applicant have shown that using a water vapor free oxidizing atmosphere improves reproducibility of alumina thickness. These tests have provided the following data:

alumina thickness obtained under air at a temperature of 1200° C. for periods in the range 0.5 hours to 0.5 hours: 0.2 $\mu$m to 5.5 $\mu$m, and thicknesses obtained at a temperature of 1100° C. for periods lying in the range 5 hours to 10 hours: 2 $\mu$m to 7.5 $\mu$m;

alumina thickness obtained under water vapor free $O_2$ in accordance with the invention and at a temperature of 1200° C. for periods lying in the range 12 hours to 24 hours: 1.5 $\mu$m to 2.5 $\mu$m;

b) easy reproducibility of alumina thickness;

c) uniform layer of alumina;
d) no pores or cracks in the alumina layer formed by pre-oxidation;
e) easy checking of oxidation thickness;
f) excellent mechanical strength of the bond between the alumina layer and the AlN substrate;
g) a fault-free $Cu/Al_2O_3$-AlN bond is obtained providing good mechanical strength; and
h) the thinness of the alumina limits the risks of cracking between the alumina and the aluminum nitride during thermal cycling tests, in spite of their very different coefficients of expansion.

Naturally, the present invention is not limited to the above-described implementations, but extends to any variant within the spirit of the invention.

For example, the invention is not limited to bonding a sheet of copper on a substrate of aluminum nitride. It may be used for fixing other types of metal sheet.

We claim:

1. A method of bonding a sheet of metal such as copper on a substrate of aluminum nitride, the method comprising the following steps known per se:
   i) growing a layer of alumina on the aluminum nitride substrate by means of heat treatment; and
   ii) placing the sheet of metal on said alumina layer and then bonding them together;
wherein alumina-growing step i) is performed under a controlled oxidizing atmosphere comprising a water vapor content less than 5 ppm.

2. A method of bonding a sheet of metal according to claim 1, wherein oxidizing step i) is performed under an atmosphere of pure oxygen which is free from water vapor.

3. A method of bonding a sheet of metal according to claim 1 wherein the oxidizing atmosphere used in step i) satisfies the following data:
   $O_2$  99.998% to 99.5%
   $H_2O < 5$ ppm
   $H_2 < 2$ ppm
   $A_rN_2 < 14$ ppm
   $CO + CO_2 < 1$ ppm.

4. A method of bonding a sheet of metal according to claim 1, wherein the sheet of metal is a sheet of copper.

5. A method of bonding a sheet of metal according to claim 1, wherein the oxidizing step i) is performed at a temperature lying in the range 1000° C. to 1200° C. for a period of time lying in the range 12 hours to 30 hours.

6. A method of bonding a sheet of metal according to claim 1, wherein oxidizing step i) is performed at a temperature lying in the range 1420° C. to 1500° C. for a period of less than 5 minutes.

7. A method of bonding a sheet of metal according to claim 1, wherein step ii) of bonding the sheet of copper onto the layer of alumina consists in:
   1) cleaning the copper to eliminate traces of oxidation from the surface thereof prior to placing the copper on the layer of alumina;
   2) heating the copper/substrate assembly under an inert atmosphere until a temperature is reached which is higher than the temperature at which a eutectic is formed; and
   3) applying an oxidizing reactive gas only after said temperature higher than the eutectic formation temperature has been obtained so that said temperature is reached before any oxidation of the surface of the copper.

* * * * *